United States Patent
Tateishi et al.

(10) Patent No.: US 7,157,142 B2
(45) Date of Patent: Jan. 2, 2007

(54) METHOD FOR PRODUCING ORGANIC, THIN-FILM DEVICE AND TRANSFER MATERIAL USED THEREIN

(75) Inventors: Tomomi Tateishi, Kanagawa-ken (JP); Nobuhiro Nishita, Kanagawa-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 2 days.

(21) Appl. No.: 10/359,178

(22) Filed: Feb. 6, 2003

(65) Prior Publication Data
US 2005/0260413 A1 Nov. 24, 2005

(30) Foreign Application Priority Data
Feb. 6, 2002 (JP) ............................. 2002-029870
Feb. 6, 2002 (JP) ............................. 2002-029871
Feb. 6, 2002 (JP) ............................. 2002-029892

(51) Int. Cl.
*B32B 7/06* (2006.01)
*H05B 33/00* (2006.01)
*H01L 51/50* (2006.01)
*B44B 1/165* (2006.01)

(52) U.S. Cl. .................. 428/411.1; 428/690; 428/917; 156/230

(58) Field of Classification Search ................ 428/411, 428/917, 690, 411.1; 156/230
See application file for complete search history.

(56) References Cited

U.S. PATENT DOCUMENTS 6,114,088 A * 9/2000 Wolk et al. ............... 430/273.1
6,667,143 B1 * 12/2003 Nirmal et al. .............. 430/200
6,824,891 B1 * 11/2004 Okada et al. ............... 428/690

FOREIGN PATENT DOCUMENTS

EP 0 851 714 A2 * 7/1998
WO WO 00/41893 A1 7/2000

* cited by examiner

*Primary Examiner*—Dawn Garrett
(74) *Attorney, Agent, or Firm*—Birch, Stewart, Kolasch & Birch, LLP

(57) ABSTRACT

A transfer material having at least one organic, thin-film layer on a temporary substrate support, wherein (a) at least one component constituting the organic, thin-film layer has a flow-starting temperature of 40° C. or higher and a transfer temperature or lower or a glass transition temperature Tg of 40° C. to 250° C., or wherein (b) at least one component constituting the organic, thin-film layer has a temperature of 40° C. to 240° C., at which its viscosity becomes $1\times10^4$ Pa·s.

8 Claims, 1 Drawing Sheet

METHOD FOR PRODUCING ORGANIC, THIN-FILM DEVICE AND TRANSFER MATERIAL USED THEREIN

FIELD OF THE INVENTION

The present invention relates to a transfer material for an organic, thin-film device and a method for producing an organic, thin-film device comprising such a transfer material.

BACKGROUND OF THE INVENTION

Much attention is drawn to organic light-emitting devices such as organic electroluminescence (EL) devices usable for surface-emitting devices. Promising as inexpensive, solid-emission-type, large-emission-area, full-color display devices and writing light source arrays, the organic light-emitting devices have been actively developed. The organic light-emitting device generally comprises a couple of electrodes (a transparent electrode and a rear-surface electrode), and a light-emitting, organic, thin-film layer formed between the electrodes. When an electric field is applied to the organic light-emitting device, electrons are injected into the light-emitting, organic, thin-film layer from the rear-surface electrode, while holes are injected thereinto from the transparent electrode. Electrons and holes are recombined in the light-emitting, organic, thin-film layer, and an energy level is lowered from a conduction band to a valence band, whereby energy is turned to light, which is emitted from the organic light-emitting device.

The organic, thin-film layers in the organic light-emitting device are generally formed by a vapor deposition method. For instance, JP 9-167684 A and JP 2000-195665 A propose methods comprising uniformly forming an organic layer on a temporary support of mica or a film by a vapor deposition method, bringing the organic layer close to the substrate, and carrying out a heating vapor deposition. However, these methods are poor in productivity because they use a vapor deposition method. In addition, because only low-molecular-weight organic compounds can be used for organic, thin-film layers, the resultant organic light-emitting devices are insufficient in durability such as bending resistance, film strength, etc. when used for flexible displays, etc. This problem is serious particularly when they have large areas.

In view of the above problems in connection with the use of low-molecular-weight organic compounds, proposals have been made to provide high-molecular-weight organic EL devices comprising light-emitting thin-film layers made of high-molecular-weight compounds, and those comprising light-emitting thin-film layers constituted by low-molecular-weight compounds dispersed in binder resins. For instance, Nature, Vol. 347, page 539, 1990 proposes a green-light-emitting, high-molecular-weight, organic EL device using poly(p-phenylenevinylene). The Japanese Journal of Applied Physics, Vol. 30, page L1938, 1991 proposes a high-molecular-weight, organic EL device using poly(3-alkylthiophene) for emitting red orange light. The Japanese Journal of Applied Physics, Vol. 30, page L1941, 1991 proposes a blue-light-emitting, high-molecular-weight, organic EL device using polyalkylfluorene. These high-molecular-weight devices are advantageous in making large-area, light-emitting devices, and their applications for flexible displays are expected. However, because the vapor deposition method cannot be used to form the organic light-emitting thin-film layers, thin-film layers are formed directly on substrates by wet methods.

The wet methods are, however, disadvantageous in that the formed organic, thin-film layers are insufficient in the uniformity of thickness because of the surface tension of solutions, and that when the organic, thin-film layers are laminated, the organic, thin-film layers tend to be dissolved in their interfaces. Accordingly, the organic, thin-film devices obtained by the wet methods are poor in light-emitting efficiency and durability of devices.

WO 00/41893 discloses a method for thermally transferring an organic, thin-film layer and a photo-thermal conversion layer onto a substrate by a laser beam by using a donor sheet having the organic, thin-film layer and the photo-thermal conversion layer. Such a thermal transfer method is disadvantageous in that a gas often penetrates into an interface between the organic, thin-film layer and the substrate. In the organic light-emitting device produced by such method, light-emitting efficiency, durability and uniformity of a light-emitting surface depend on conditions of the interface, the penetration of gas resulting in poor light-emitting properties.

In the case of thermal writing in a predetermined pattern using a thermal head or a laser common in printing technologies, a temperature distribution generated around an organic thin film pattern by thermal diffusion blurs its outline, failing to cut the organic thin film pattern from the donor accurately. Thus, organic light-emitting devices produced by this method are uneven in light emission and likely to suffer from poor durability, because of insufficient electric connection and the breakage of the organic, thin-film layer. Further, yield is likely to be low because of low-accuracy positioning of the substrate and the thermal head or laser beam.

OBJECTS OF THE INVENTION

Accordingly, an object of the present invention is to provide a method for producing an organic, thin-film device having excellent uniformity and adhesion interface by forming an organic, thin-film layer on a substrate by a simple apparatus at a low cost, particularly a method for efficiently producing an organic, thin-film device such as an organic EL device excellent in light-emitting efficiency, uniformity of light emission and durability by using a transfer material having a uniform organic, thin-film layer formed on a temporary substrate support.

Another object of the present invention is to provide a transfer material usable in such a method.

SUMMARY OF THE INVENTION

As a result of intense research in view of the above objects, the inventors have found that by forming at least one organic, thin-film layer constituting an organic, thin-film device on a temporary support, and satisfying, in transferring the organic, thin-film layer onto a substrate, any one of the conditions that (a) at least one component constituting the organic, thin-film layer has a flow-starting temperature of 40° C. or higher and a transfer temperature or lower, that (b) at least one component constituting the organic, thin-film layer has a glass transition temperature Tg of 40° C. to 250° C., and that (c) at least one component constituting the organic, thin-film layer has a temperature for reaching a predetermined viscosity at a desired level, it is possible to produce an organic, thin-film device such as an organic EL device, etc. excellent in light-emitting efficiency, uniformity of light emission and durability at a low cost. The present invention has been accomplished based on this finding.

Thus, the first transfer material of the present invention has at least one organic, thin-film layer on a temporary substrate support, wherein at least one component constituting the organic, thin-film layer has a flow-starting temperature of 40° C. or higher and a transfer temperature or lower.

The second transfer material of the present invention has at least one organic, thin-film layer on a temporary substrate support, wherein at least one component constituting the organic, thin-film layer has a glass transition temperature Tg of 40° C. to 250° C.

The third transfer material of the present invention has at least one organic, thin-film layer on a temporary substrate support, wherein at least one component constituting the organic, thin-film layer has a temperature of 40° C. to 240° C., at which its viscosity becomes $1 \times 10^4$ Pa·s.

The first to third transfer materials of the present invention preferably meet the following requirements:
(1) The organic, thin-film layer contains at least a light-emitting compound and/or a carrier-transporting compound.
(2) The organic, thin-film layer has a dry thickness of 6 nm to 600 nm.
(3) The transfer material is in a continuous web shape.

The first method for producing an organic, thin-film device according to the present invention comprises the steps of (a) overlapping a transfer material comprising at least one organic, thin-film layer on a temporary support and a substrate, such that the organic, thin-film layer faces a surface to be coated of the substrate, and heating and/or pressing them, and (b) peeling the temporary support from the transfer material to transfer the organic, thin-film layer onto the surface of the substrate, wherein at least one component constituting the organic, thin-film layer has a flow-starting temperature of 40° C. or higher and a transfer temperature or lower.

The second method for producing an organic, thin-film device according to the present invention comprises the steps of (a) overlapping a transfer material comprising at least one organic, thin-film layer on a temporary support and a substrate, such that the organic, thin-film layer faces a surface to be coated of the substrate, and heating and/or pressing them, and (b) peeling the temporary support from the transfer material to transfer the organic, thin-film layer onto the surface of the substrate, wherein at least one component constituting the organic, thin-film layer has a glass transition temperature Tg of 40° C. to 250° C.

The third method for producing an organic, thin-film device according to the present invention comprises the steps of (a) overlapping a transfer material comprising at least one organic, thin-film layer on a temporary support and a substrate, such that the organic, thin-film layer faces a surface to be coated of the substrate, and heating and/or pressing them, and (b) peeling the temporary support from the transfer material to transfer the organic, thin-film layer onto the surface of the substrate, wherein at least one component constituting the organic, thin-film layer has a temperature of 40° C. to 240° C., at which its viscosity becomes $1 \times 10^4$ Pa·s.

The first to third methods of the present invention preferably meet the following requirements:
(1) An organic, thin-film layer containing at least a light-emitting compound and/or a carrier-transporting compound is used.
(2) The transfer material and/or the substrate is in a continuous web shape.

(3) At least one of a hole-transporting, organic, thin-film layer, a light-emitting, organic, thin-film layer and an electron-transporting, organic, thin-film layer is formed in this order from the side of the substrate.
(4) A substrate constituted by a substrate support and a transparent, conductive layer formed thereon is used.

DETAILED DESCRIPTION OF THE PREFERRED EMBODIMENTS

[1] Transfer Material (1) Structure

Figure 1:
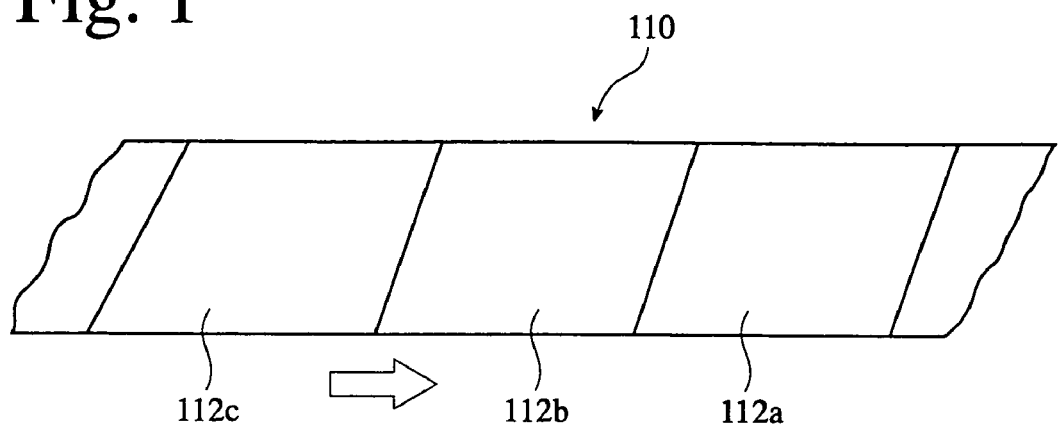
FIG. 1 is a plan view showing a transfer material having a plurality of successive planes each constituted by an organic, thin-film layer according to an embodiment of the present invention.

The organic, thin-film layer is preferably formed on a temporary support by a wet method. The transfer material provided with the organic, thin-film layer may be produced as separate transfer materials, or a plurality of successive planes each constituted by the organic, thin-film layer may be formed on one temporary support as shown in FIG. 1. Namely, a plurality of organic, thin-film layers 112a, 112b, 112c, . . . may be formed on one temporary support successively in a progressing direction. In this case, a plurality of organic, thin-film layers can continuously be formed without necessitating the exchange of the transfer materials.

Alternatively, when a transfer material having two or more organic, thin-film layers laminated in advance on a temporary support is used, a multi-layer thin-film layer can be laminated on a surface to be coated of the substrate by a single transfer step. In a case where the organic, thin-film layers are laminated on a temporary support in advance, there would be ununiformity in the mobility of holes and electrons unless each organic, thin-film layer laminated has a uniform interface. Accordingly, it is necessary to select a solvent cautiously to obtain a uniform interface, and it is necessary to select an organic compound for the organic, thin-film layer, which is soluble in the above solvent.

(2) Temporary Substrate Support

The temporary support used in the present invention should be made of a material that has chemical stability, thermal stability and flexibility. Specific examples of the materials include fluororesins such as a tetrafluoroethylene resin (PTFE), a trifluorochloroethylene resin; polyesters such as polyethylene terephthalate and polyethylene naphthalate (PEN); polyarylates; polycarbonates; polyolefins such as polyethylene and polypropylene; polyether sulfone (PES); etc. The temporary support is particularly preferably a thin sheet made of at least one of these materials or a laminate thereof. The thickness of the temporary support is preferably 1 μm to 300 μm, more preferably 3 μm to 200 μm, particularly 5 μm to 150 μm.

The temporary support may be either a single-layer film or a multi-layer film. In the case of the multi-layer film (laminate), the temporary support may be produced by forming at least one flat layer on the side of the substrate onto which the organic, thin-film layer is transferred. Materials for constituting the flat layer are not particularly restrictive.

(3) Organic, Thin-film Layer (a) Requirements of at Least One Component

With at least one component constituting the organic, thin-film layer satisfying the following requirements concerning a flow-starting temperature, a glass transition temperature Tg or a viscosity, it is possible to obtain an organic, thin-film device excellent in light-emitting efficiency, the uniformity of light emitted and durability. The organic, thin-film layer containing at least one component satisfying each requirement will be explained as the first, second and third organic, thin-film layers in detail below.

(i) First Organic, Thin-film Layer

At least one component constituting the first organic, thin-film layer satisfies the requirement that it has a flow-starting temperature of 40° C. or higher and a transfer temperature or lower. The flow-starting temperature lower than 40° C. is not preferable because of such defect that the organic, thin-film layer would be transferred onto the opposite surface of the transfer material when stacked. The flow-starting temperature exceeding the transfer temperature is also not preferable, because the first organic, thin-film layer would not easily be transferred. The flow-starting temperature is preferably 50° C. or higher and a transfer temperature or lower, more preferably 60° C. or higher and transfer temperature or lower.

The flow-starting temperature, which is different from a usual softening temperature, is a parameter expressing a flowing phenomenon under the conditions of heating and pressing. Specifically, using a Koka-shiki FLOWTESTER CFT-500 available from Shimadzu Corporation, the component is caused to flow from an orifice of 1 mm in inner diameter under a load of 20 Kg/cm$^2$ while heating at a constant temperature elevation speed, and a temperature at which it starts to flow (flow-starting temperature) is measured.

(ii) Second Organic, Thin-film Layer

At least one component constituting the second organic, thin-film layer satisfies the requirement that its glass transition temperature Tg is 40° C. to 250° C. The glass transition temperature Tg lower than 40° C. is not preferable because of such defect that the second organic, thin-film layer would be transferred onto the opposite surface of the transfer material when stacked. The glass transition temperature Tg exceeding 250° C. is also not preferable, because the second organic, thin-film layer would not easily be transferred. The glass transition temperature Tg is preferably 50° C. to 250° C., more preferably 60° C. to 220° C. The glass transition temperature Tg can be measured, for instance, by using a differential scanning calorimeter (DSC).

(iii) Third Organic, Thin-film Layer

At least one component constituting the third organic, thin-film layer satisfies the requirement that a temperature, at which its viscosity becomes $1 \times 10^4$ Pa·s, is 40° C. to 240° C. This temperature is called "predetermined viscosity-reaching temperature." If the predetermined viscosity-reaching temperature were lower than 40° C., the third organic, thin-film layer would likely be transferred onto a rear surface of the adjacent transfer material when a plurality of transfer materials are stacked. On the other hand, if the predetermined viscosity-reaching temperature were higher than 240° C., it would be difficult to transfer the organic, thin-film layer by heating and pressing rolls, etc. The lower limit of the predetermined viscosity-reaching temperature is preferably 50° C., particularly 60° C. Also, the upper limit of the predetermined viscosity-reaching temperature is preferably 200° C. The viscosity of a component constituting the organic, thin-film layer can be measured by using, for instance, FLOWTESTER CFT-500 available from Shimadzu Corporation.

(iv) Content of Each Component

In each of the first to third organic, thin-film layers, the content of each of the above components is preferably 0.1 to 100% by mass, more preferably 1 to 90% by mass, particularly 3 to 80% by mass, based on the total amount (100% by mass) of the organic, thin-film layer, though it may vary depending on its type.

(b) Binder

When each organic, thin-film layer contains a polymer binder as a constituent component, it is preferable to select a polymer meeting any one of the above requirements. When a plurality of polymer binders are used, at least one of them need only meet any of the above requirements, and all of the polymer binders may not meet any of the above requirements.

Examples of polymer binders usable for the present invention include polyvinyl chloride, polycarbonates, polystyrene, polymethyl methacrylate, polybutyl methacrylate, polyesters, polysulfones, polyphenylene oxide, polybutadiene, hydrocarbon resins, ketone resins, phenoxy resins, polyamides, ethyl cellulose, polyvinyl acetate, ABS resins, polyurethanes, melamine resins, unsaturated polyesters, alkyd resins, epoxy resins, silicone resins, polyvinyl butyral, polyvinyl acetal, etc. The light-emitting, organic, thin-film layer containing at least one polymer binder can be easily formed with a large area by the wet film-forming method.

Each organic, thin-film layer containing the above polymer binder is preferably formed on the temporary support by a wet method. Materials for the organic, thin-film layer are dissolved in an organic solvent at a desired concentration, and the resultant solution is coated onto the temporary substrate support. Coating methods are not particularly limited, as long as they can form the organic, thin-film layer that has a thickness of 200 nm or less and a uniform thickness distribution after drying. Examples of the coating methods include a spin coating method, a gravure coating method, a dip coating method, a casting method, a die coating method, a roll coating method, a bar coating method, an extrusion coating method, an ink-jet coating method, etc. Preferable among them is a high-productivity, roll-to-roll extrusion coating method.

(4) Structure of Organic, Thin-film Layer

The organic, thin-film layer, which is a layer constituting the organic, thin-film device, includes a light-emitting, organic, thin-film layer, an electron-transporting, organic, thin-film layer, a hole-transporting, organic, thin-film layer, an electron-injecting layer, a hole-injecting layer, etc., depending on their characteristics. The transfer material of the present invention may comprise any one or a plurality of these layers. In addition, various layers for improving light emission may be included. Incidentally, the dry thickness of the organic, thin-film layer is preferably 6 nm to 600 nm, more preferably 6 nm to 450 nm, further preferably 6 nm to 300 nm.

(a) Light-Emitting, Organic, Thin-film Layer

The light-emitting, organic, thin-film layer comprises at least one light-emitting compound. Though not restrictive, the light-emitting compound may be a fluorescent compound or a phosphorescent compound. The fluorescent compound and the phosphorescent compound may be used in combination. In the present invention, the phosphorescent compound is preferably used from the viewpoints of a light-emitting brightness and a light-emitting efficiency.

Examples of the fluorescent compound used in this invention include benzoxazole derivatives; benzoimidazole derivatives; benzothiazole derivatives; styrylbenzene derivatives; polyphenyl derivatives; diphenylbutadiene derivatives; tetraphenylbutadiene derivatives; naphthalimido derivatives; coumarin derivatives; perylene derivatives; perynone derivatives; oxadiazole derivatives; aldazine derivatives; pyralidine derivatives; cyclopentadiene derivatives; bis(styryl)anthracene derivatives; quinacridon derivatives; pyrrolopyridine derivatives; thiadiazolopyridine derivatives; styrylamine derivatives; aromatic dimethylidine compounds; metal complexes such as 8-quinolinol metal complexes and derivatives thereof and rare-earth metal complexes; light-emitting polymer material such as polythiophene derivatives, polyphenylene derivatives, polyphenylenevinylene derivatives and polyfluorene derivatives; etc. The fluorescent compounds may be used alone or in combination.

The phosphorescent compound preferably utilizes triplet excitons for light emission. The phosphorescent compound is preferably an ortho-metallation complex or a porphyrin complex. The porphyrin complex is preferably a porphyrin-platinum complex. The phosphorescent compounds may be used alone or in combination.

The ortho-metallation complex used in the present invention may be such a compound that is described in Akio Yamamoto, "Metalorganic Chemistry, Foundation and Application", pages 150 to 232, Shokabo Publishing Co., Ltd., (1982); H. Yersin, "Photochemistry and Photophysics of Coordination Compounds," pages 71 to 77 and 135 to 146, Springer-Verlag, Inc. (1987), etc. Although ligands of the ortho-metallation complexes are not particularly limited, the ortho-metallation complexes generally have particular ligands. Preferred examples of the particular ligands include 2-phenylpyridine derivatives, 7,8-benzoquinoline derivatives, 2-(2-thienyl) pyridine derivatives, 2-(1-naphthyl) pyridine derivatives and 2-phenylquinoline derivatives. The derivatives may have a substituent. The ortho-metallation complexes may have other ligands than the particular ligands. Center metal atoms of the ortho-metallation complexes may be selected from transition metals. The center metals are preferably rhodium, platinum, gold, iridium, ruthenium or palladium. The organic, thin-film layer comprising such an ortho-metallation complex is excellent in the brightness of light emitted and light-emitting efficiency. Complexes disclosed in JP 2000-254171 A may be used as the ortho-metallation complexes in the present invention.

The ortho-metallation complex used in the present invention may be synthesized by a known method disclosed in Inorg. Chem., 30, 1685, 1991; Inorg. Chem., 27, 3464, 1988; Inorg. Chem., 33, 545, 1994; Inorg. Chim. Acta, 181, 1245, 1991; J. Organomet. Chem., 335, 293, 1987; J. Am. Chem. Soc., 107, 1431, 1985; etc.

Though not restrictive, the content of the light-emitting compound in the light-emitting, organic, thin-film layer is, for instance, preferably 0.1 to 70% by mass, more preferably 1 to 20% by mass. When the content of the light-emitting compound is less than 0.1% by mass or more than 70% by mass, the effect of adding the light-emitting compound tends to be insufficient.

The light-emitting, organic, thin-film layer may contain a host compound, a hole-transporting material, an electron-transporting material, an electrically inactive polymer binder, etc., if necessary. Incidentally, the functions of these materials may be able to be achieved by only one compound. For instance, a carbazole derivative function not only as a host compound but also as a hole-transporting material.

The host compound is a compound causing energy transfer from its excited state to the light-emitting compound, resulting in accelerating the light emission of the light-emitting compound. Examples of the host compounds include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from a heterocyclic tetracarboxylic acid having a structure such as naphthaleneperylene, phthalocyanine derivatives, 8-quinolinol metal complexes and derivatives thereof, metallophthalocyanines, metal complexes containing a benzoxazole ligand or a benzothiazole ligand, polysilane compounds, poly(N-vinylcarbazole) derivatives, aniline copolymers, electrically conductive polymers and oligomers such as oligothiophenes and polythiophenes, polythiophene derivatives, polyphenylene derivatives, polyphenylenevinylene derivatives, polyfluorene derivatives, etc. The host compounds may be used alone or in combination.

Though not restrictive, the hole-transporting materials may be low- or high-molecular-weight materials if they have any of functions of injecting holes from the positive electrode into the light-emitting, organic, thin-film layer, transporting holes and blocking electrons from the negative electrode. Examples of the hole-transporting materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electrically conductive polymers and oligomers such as oligothiophenes and polythiophenes, polythiophene derivatives, polyphenylene derivatives, polyphenylenevinylene derivatives, polyfluorene derivatives, etc. These hole-transporting materials may be used alone or in combination.

The electron-transporting materials are not particularly limited as long as they have any of functions of injecting electrons from the negative electrode into the light-emitting, organic, thin-film layer, transporting electrons, and blocking holes from the positive electrode. Examples of the electron-transporting materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from a heterocyclic tetracarboxylic acid having a structure such as naphthaleneperylene, phthalocyanine derivatives, 8-quinolinol metal complexes and derivatives thereof, metallophthalocyanines, metal complexes containing a benzoxazole ligand or a benzothiazole ligand, aniline copolymers, electrically conductive polymers and oligomers such as oligothiophenes and polythiophenes, polythiophene derivatives, polyphenylene derivatives, polyphenylenevinylene derivatives, polyfluorene derivatives, etc.

The dry thickness of the light-emitting, organic, thin-film layer is preferably 2 nm to 200 nm, more preferably 10 nm to 150 nm, and particularly 20 nm to 100 nm. When the thickness of the light-emitting, organic, thin-film layer exceeds 200 nm, driving voltage is likely to rise. On the other hand, when the thickness of the light-emitting, organic, thin-film layer is less than 2 nm, short-circuiting is likely to occur in the organic, thin-film device.

(b) Hole-transporting, Organic, Thin-film Layer

The organic, thin-film device may comprise a hole-transporting, organic, thin-film layer made of the above hole-transporting material, if necessary. The hole-transporting, organic, thin-film layer may contain the above polymer binder. The dry thickness of the hole-transporting, organic, thin-film layer is preferably 2 nm to 200 nm, more preferably 10 nm to 150 nm, further preferably 20 nm to 100 nm. When the thickness exceeds 200 nm, driving voltage is likely to rise. On the other hand, when it is less than 2 nm, short-circuiting is likely to occur in the organic, thin-film device.

(c) Electron-Transporting, Organic, Thin-film Layer

The organic, thin-film device may have an electron-transporting, organic, thin-film layer made of the above electron-transporting material, if necessary. The electron-transporting, organic, thin-film layer may contain the above polymer binder. The dry thickness of the electron-transporting, organic, thin-film layer is preferably 2 nm to 200 nm, more preferably 10 nm to 150 nm, further preferably 20 nm to 100 nm. When the thickness exceeds 200 nm, driving voltage is likely to rise. On the other hand, when it is less than 2 nm, short-circuiting is likely to occur in the organic, thin-film device.

[2] Method for Producing Organic, Thin-film Device

The first method of the present invention comprises the steps of using a transfer material having at least one organic, thin-film layer formed on a temporary substrate support, and transferring the organic, thin-film layer onto the substrate by a peeling transfer method, at least one component constituting the organic, thin-film layer having a flow-starting temperature of 40° C. or higher and a transfer temperature or lower.

The second method of the present invention comprises the steps of using a transfer material having at least one organic, thin-film layer on a temporary substrate support, and transferring the organic, thin-film layer onto the substrate by a peeling transfer method, at least one component constituting the organic, thin-film layer having a glass transition temperature Tg of 40° C. to 250° C.

The third method of the present invention comprises the steps of using a transfer material having at least one organic, thin-film layer formed on a temporary substrate support, and transferring the organic, thin-film layer onto the substrate by a peeling transfer method, at least one component constituting the organic, thin-film layer having a temperature of 40° C. to 240° C., at which its viscosity becomes $1 \times 10^4$ Pa·s.

The peeling transfer method comprises the steps of heating and/or pressing a transfer material to soften an organic, thin-film layer, which is adhered to a surface to be coated of the substrate, and peeling the temporary support so that only the organic, thin-film layer remains on the surface to be coated. Heating means may be generally known apparatuses, for instance, a laminator, an infrared heater, a laser, a thermal head, etc. Usable as the thermal head is, for instance, First Laminator VA-400III available from Taisei Laminator K. K., a thermal head for a thermal transfer printer, etc.

The transfer temperature may vary depending on the materials of the organic, thin-film layer and the heating member. It is, however, preferably 40° C. to 250° C., more preferably 50° C. to 200° C., particularly 60° C. to 180° C. It should be noted that a preferred range of the transfer temperature is related to the heat resistance of the heating member, the transfer material and the substrate, meaning that as the heat resistance increases, the transfer temperature is elevated accordingly.

Figure 2:
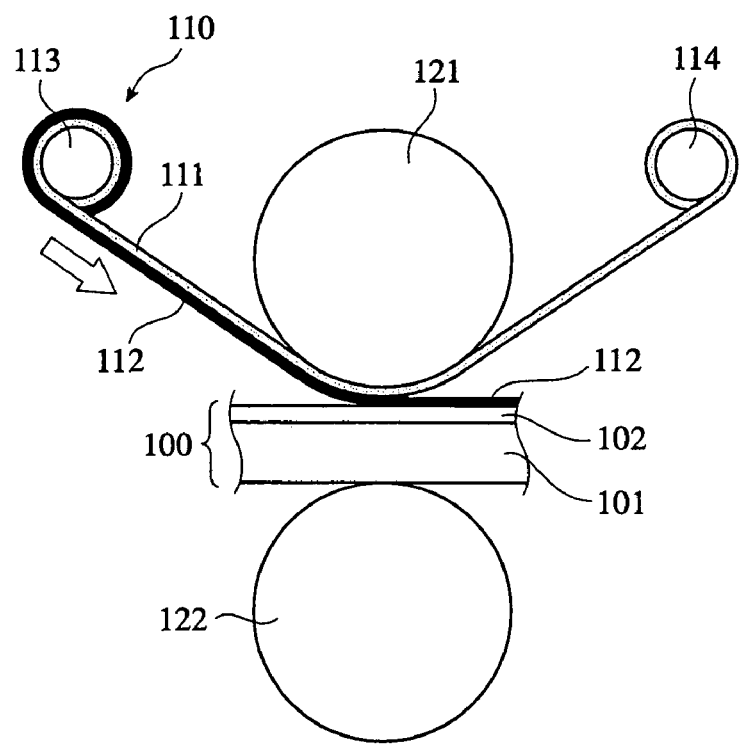
FIG. 2 is a schematic cross-sectional view showing one example of apparatuses for carrying out a method for producing an organic, thin-film device according to the present invention.

FIG. 2 shows one example of apparatuses for carrying out the method of the present invention for producing the organic, thin-film device, though the present invention is not restricted thereto. A transfer material 110 having an organic, thin-film layer 112 on a temporary support 111 is supplied from a transfer material-winding roll 113. A transfer apparatus comprises a heating (pressing) roll 121 and a pressing (heating) roll 122. A substrate 100 constituted by a substrate support 101 and a transparent, conductive layer (cathode or anode) 102 is arranged between a heating (pressing) roll 121 and a pressing (heating) roll 122, and a transfer material 110 is supplied between the heating (pressing) roll 121 and the transparent, conductive layer 102 of the substrate 100, such that the transparent, conductive layer 102 of the substrate 100 is brought into contact with the organic, thin-film layer 112 of the transfer material 110. By heating or pressing by the heating (pressing) roll 121, or by heating while pressing by the heating (pressing) roll 121 and the pressing (heating) roll 122, the organic, thin-film layer 112 is transferred onto the transparent, conductive layer 102 of the substrate 100. The remaining temporary support 111 is wound by a temporary substrate support-winding roll 114.

In the present invention, the step of transferring the organic, thin-film layer 112 and the step of peeling the temporary support 111 can be repeated to laminate a plurality of organic, thin-film layers on the substrate. A plurality of organic, thin-film layers may have the same composition or different compositions. The same composition is advantageous in preventing the lack of a layer by poor transfer and peeling. In the case of providing different layers, it is possible to provide a design having improved light-emitting efficiency with separate functions assigned to different layers. It is possible to laminate, for instance, a light-emitting, organic, thin-film layer/an electron-transporting, organic, thin-film layer/(an electron-injecting layer or a hole-injecting layer)/a hole-transporting, organic, thin-film layer/a light-emitting, organic, thin-film layer/an electron-transporting, organic, thin-film layer/an electron-injecting layer on a surface to be coated by the transfer method of the present invention.

The organic, thin-film layer transferred onto the substrate, or a new organic, thin-film layer transferred onto the previously transferred organic, thin-film layer is preferably reheated, if necessary. A surface treatment for improving the adhesiveness of a surface to be coated may be carried out between the previous transferring step and the next transferring step, such that the previous transfer layer is not reversely transferred onto the next transfer layer. Such surface treatment includes, for instance, an activation treatment such as a corona discharge treatment, a flame treatment, a glow discharge treatment, a plasma treatment, etc.

[3] Organic, Thin-film Device (1) Structure

The organic, thin-film device can have the following laminate structures or the opposite laminate structures on the substrate support.

(a) Transparent, conductive layer/light-emitting, organic, thin-film layer/rear-surface electrode;
(b) Transparent, conductive layer/light-emitting, organic, thin-film layer/electron-transporting, organic, thin-film layer/rear-surface electrode;
(c) Transparent, conductive layer/hole-transporting, organic, thin-film layer/light-emitting, organic, thin-film layer/electron-transporting, organic, thin-film layer/rear-surface electrode;
(d) Transparent, conductive layer/hole-transporting, organic, thin-film layer/light-emitting, organic, thin-film layer/rear-surface electrode;
(e) Transparent, conductive layer/light-emitting, organic, thin-film layer/electron-transporting, organic, thin-film layer/electron-injecting organic, thin-film layer/rear-surface electrode; and
(f) Transparent, conductive layer/hole-injecting organic, thin-film layer/hole-transporting, organic, thin-film layer/light-emitting, organic, thin-film layer/electron-transporting, organic, thin-film layer/electron-injecting organic, thin-film layer/rear-surface electrode.

The light-emitting, organic, thin-film layer comprises a fluorescent compound and/or a phosphorescent compound, and light emission is generally derived from the transparent, conductive layer. Specific examples of compounds used in each organic, thin-film layer are described in, for instance, "Organic EL Display" (Technotimes Co., Separate Volume of "Monthly Display," the October issue of 1998), etc.

(2) Substrate Support

Examples of materials used for the substrate support include inorganic materials such as yttrium-stabilized zirconia (YSZ) and glass; polymers such as polyesters (polyethylene terephthalate, polybutylene terephthalate, polyethylene naphthalate, etc.), polystyrenes, polycarbonates, polyether sulfone, polyarylates, allyldiglycolcarbonate, polyimides, polycyclolefins, norbomene resins, poly(chlorotrifluoroethylene), Teflon, polytetrafluoroethylene-polyethylene copolymers; etc. The substrate support may be made of one material or a plurality of materials. Preferable among these materials are the above polymers that can produce a flexible organic, thin-film device, and more preferable are polyesters, polycarbonates, polyether sulfone, fluorine-containing polymers such as polychlorotrifluoroethylene, Teflon and polytetrafluoroethylene-polyethylene copolymers, which are excellent in heat resistance, dimensional stability, solvent resistance, insulation and workability with little gas permeability and hygroscopicity.

The shape, structure and size of the substrate support may be appropriately determined in accordance with purposes and applications of the organic, thin-film device. The substrate support is generally in a shape of plate or sheet. The substrate support may have a single-layer structure or a multi-layer structure. The substrate support may be composed of one member or a plurality of members. Though the substrate support may be colorless transparent or colored transparent, it is preferably colorless transparent so that light emitted from the light-emitting, organic, thin-film layer is not scattered or attenuated.

A moisture permeation-inhibiting layer (gas barrier layer) may be formed on one or both surfaces of the substrate support. The gas barrier layer is preferably made of an inorganic compound such as silicon nitride, silicon oxide, etc. The gas barrier layer can be formed by a radio frequency sputtering method, etc. Further, a hard coating layer and an undercoating layer may be formed on the substrate support, if necessary.

(3) Electrode (Negative Electrode or Positive Electrode)

Both of the transparent, conductive layer and the rear-surface electrode may be used as a cathode or an anode, which is determined by the structure of the organic, thin-film device.

(a) Transparent, Conductive Layer (Transparent Electrode)

The transparent, conductive layer can function not only as a positive electrode for supplying holes to the organic compound layer but also as a negative electrode. The transparent, conductive layer will be explained below in a case where it acts as the positive electrode.

Though not restrictive, the shape, structure and size of the transparent, conductive layer may be appropriately selected in accordance with the applications and purposes of the organic, thin-film device. The transparent, conductive layer may be made of metals, alloys, metal oxides, electrically conductive compounds, mixtures thereof, etc. The transparent, conductive layer is preferably made of a material having a work function of 4 eV or more. Examples of the materials for the transparent, conductive layer include antimony-doped tin oxide (ATO); fluorine-doped tin oxide (FTO); semiconductive metal oxides such as tin oxide, zinc oxide, indium oxide, indium tin oxide (ITO) and indium zinc oxide (IZO); metals such as gold, silver, chromium and nickel; mixtures and laminates of the metals and conductive metal oxides; inorganic conductive compounds such as copper iodide and copper sulfide; organic conductive compounds such as polyaniline, polythiophene and polypyrrole; laminates of the organic conductive compounds and ITO; etc.

Though not restrictive, the method for forming the transparent, conductive layer may be appropriately selected from wet methods such as a printing method and a coating method; physical methods such as a vacuum deposition method, a sputtering method and an ion-plating method; chemical methods such as a CVD method and a plasma CVD method; etc., depending on the material used therefor. For example, when the transparent, conductive layer is made of ITO, it may preferably be formed by a DC or RF sputtering method, a vapor deposition method, an ion-plating method, etc. The transparent, conductive layer of the organic conductive compound is preferably formed by the wet method.

The patterning of the transparent, conductive layer may be conducted by a chemical etching method such as a photolithography method or a physical etching method using laser beams, etc. In addition, the transparent, conductive layer may be patterned by vacuum vapor deposition or sputtering with a mask, a lift-off method, a printing method, etc.

Though not restrictive, the position of the transparent, conductive layer formed in the organic, thin-film device may be appropriately determined in accordance with the applications and purposes of the organic, thin-film device. The transparent, conductive layer is preferably formed on the substrate support. The transparent, conductive layer may be formed on all or part of the substrate support surface.

The thickness of the transparent, conductive layer may be properly controlled depending on the material used therefor. The thickness of the transparent, conductive layer is generally 10 nm to 50 μm, preferably 50 nm to 20 μm. The resistance of the transparent, conductive layer is preferably $10^3$ Ω/square or less, more preferably $10^2$ Ω/square or less. The transparent, conductive layer may be colorless transparent or colored transparent. The light transmittance of the transparent, conductive layer is preferably 60% or more, more preferably 70% or more to allow light emission from the transparent, conductive layer side. The light transmittance can be measured by a known method using a spectrophotometer.

Further, electrodes described in detail in "Developments of Transparent Conductive Films" supervised by Yutaka Sawada, CMC Publishing Co., Ltd., 1999, etc. may be used in the present invention. Particularly in the case of using a low-heat-resistance plastic substrate support, it is preferable that the transparent, conductive layer is made of ITO or IZO and formed at a low temperature of 150° C. or lower.

(b) Rear-surface Electrode

The rear-surface electrode functions as a cathode for injecting electrons into the organic compound layer, though it may function as an anode. The rear-surface electrode will be explained below in a case where it acts as a cathode.

Though not restrictive, the shape, structure and size of the rear-surface electrode may be appropriately selected in accordance with the applications and purposes of the organic, thin-film device. The rear-surface electrode may be made of metals, alloys, metal oxides, electrically conductive compounds, mixtures thereof, etc. The rear-surface electrode is preferably made of a material having a work function of 4.5 eV or less. Examples of the materials used for the rear-surface electrode include alkali metals such as Li, Na, K and Cs; alkaline earth metals such as Mg and Ca; gold; silver; lead; aluminum; a sodium-potassium alloy; a lithium-aluminum alloy; a magnesium-silver alloy; indium; rare earth metals such as ytterbium; etc. Although the materials may be used alone, the rear-surface electrode is preferably made of a plurality of materials to improve both of stability and electron injection property. Preferable among the above materials are alkali metals and alkaline earth metals from the viewpoint of the electron injection property, and aluminum-based materials from the viewpoint of stability during storage. Usable as the aluminum-based materials are aluminum itself and aluminum-based alloys and mixtures containing 0.01 to 10% by weight of alkali metals or alkaline earth metals, such as a lithium-aluminum alloy, a magnesium-aluminum alloy, etc. The rear-surface electrode may be made of a material disclosed in JP 2-15595 A and JP 5-121172 A, etc.

Though not restrictive, the method for forming the rear-surface electrode may be appropriately selected from wet methods such as a printing method and a coating method; physical methods such as a vacuum deposition method, a sputtering method and an ion-plating method; chemical methods such as a CVD method and a plasma CVD method; etc., depending on the materials used therefor. In the case of using a plurality of materials for the rear-surface electrode, the materials may be spattered simultaneously or successively. The patterning of the rear-surface electrode can be carried out in the same manner as in the transparent, conductive layer.

Although the position of the rear-surface electrode formed in the organic, thin-film device may be appropriately determined in accordance with the applications and purposes of the organic, thin-film device, the rear-surface electrode is preferably formed on the organic, thin-film layer. The rear-surface electrode may be formed on all or part of the organic, thin-film layer surface. Further, a dielectric layer may be formed between the rear-surface electrode and the organic layer. The dielectric layer may be made of a fluorinated alkali or alkaline earth metal, having a thickness of 0.1 nm to 5 nm. The dielectric layer may be formed by a vacuum vapor deposition method, a sputtering method, an ion-plating method, etc.

The thickness of the rear-surface electrode may be properly controlled depending on the material used therefor. The thickness of the rear-surface electrode is generally 10 nm to 5 μm, preferably 50 nm to 1 μm. The rear-surface electrode may be transparent or opaque. The transparent rear-surface electrode may be a laminate composed of a thin layer of the above-mentioned material having a thickness of 1 nm to 10 nm and a transparent, conductive layer of ITO, IZO, etc.

(4) Patterning

To form the organic, thin-film layer in a fine pattern, a mask (fine mask) having openings in a fine pattern is used. Though not restrictive, the mask is preferably made of highly durable, inexpensive materials such as metals, glass, ceramics, heat-resistant resins, etc. A plurality of materials may be used in combination. The thickness of the mask is preferably 2 μm to 100 μm, more preferably 5 μm to 60 μm from the viewpoint of mechanical strength and the transfer accuracy of the organic, thin-film layer.

The openings are preferably tapered from the transfer material side to the substrate side, such that the organic, thin-film layer of the transfer material is adhered to the under transparent, conductive layer or the under other organic, thin-film layer in precisely the same shape as each opening of the mask.

(5) Other Layers

As layers constituting the organic, thin-film device, it is preferable to form a protection layer and a sealing layer to prevent the light-emitting performance from deteriorating. The transfer material may further be provided with a peeling layer between the temporary support and the organic, thin-film layer, and an adhesive layer between the organic, thin-film layer and the surface to be coated to improve transferability, unless the light-emitting performance is affected.

(a) Protective Layer

The organic, thin-film device of the present invention may comprise the protective layer disclosed in JP 7-85974 A, JP 7-192866 A, JP 8-22891 A, JP 10-275682 A and JP 10-106746 A, etc. The protective layer is generally formed on the uppermost surface of the organic, thin-film device. For example, in the organic, thin-film device in which the substrate support, the transparent, conductive layer, the organic, thin-film layers and the rear-surface electrode are formed in this order, the uppermost surface is the outer surface of the rear-surface electrode. Further, for instance, in the organic, thin-film device in which the substrate support, the rear-surface electrode, the organic, thin-film layers and the transparent, conductive layer are formed in this order, the uppermost surface is the outer surface of the transparent, conductive layer. The shape, size and thickness of the protective layer are not particularly limited. The protective layer may be made of any material that can prevent substances such as water and oxygen degrading the function of the organic, thin-film device from entering or penetrating into the device. Silicon oxide, silicon dioxide, germanium oxide, germanium dioxide, etc. may be used for the protective layer.

Though not restrictive, the protective layer may be formed by a vacuum deposition method, a sputtering method, an activated sputtering method, a molecular beam epitaxy (MBE) method, a cluster ion beam method, an ion-plating method, a plasma polymerization method, a plasma CVD method, a laser CVD method, a thermal CVD method, a coating method, etc.

(b) Sealing Layer

The sealing layer is preferably formed in the organic, thin-film device to prevent water and oxygen from entering or permeating into the device. Examples of materials for the sealing layer include copolymers of tetrafluoroethylene and at least one comonomer, fluorine-containing copolymers having cyclic structures in their main chains, polyethylene, polypropylene, polymethyl methacrylate, polyimides, polyureas, polytetrafluoroethylene, polychlorotrifluoroethylene, polydichlorodifluoroethylene, copolymers of chlorotrifluoroethylene or dichlorodifluoroethylene and other comonomers, moisture-absorbing substances having water absorption of 1% or more, moisture-resistant substances having a water absorption of 0.1% or less, metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, liquid fluorinated carbons such as perfluoroalkanes, perfluoroamines and perfluoroethers, dispersions prepared by adding substances for adsorbing moisture or oxygen to liquid fluorinated carbons, etc.

The organic compound layers are preferably sealed by sealing parts such as sealing plates and sealing containers to shield the device from moisture, oxygen, etc. from outside. The sealing parts may be formed only on the rear-surface electrode side. Alternatively, the entire light-emitting structure may be covered with the sealing parts. The shape, size and thickness of the sealing parts are not particularly limited as long as the sealing parts can seal and shield the organic compound layer from outside air. The sealing parts may be made of glass, stainless steel, metals such as aluminum, plastics such as polychlorotrifluoroethylene, polyesters and polycarbonates, ceramics, etc.

A sealing agent or an adhesive may be used to form the sealing parts on the light-emitting structure. In the case of covering the entire light-emitting structure with the sealing parts, the sealing parts may be partially heat-welded with each other without using a sealing agent. Usable as the sealing agent are ultraviolet-curing resins, thermosetting resins, two-part-type hardening resins, etc.

Further, a water-absorbing agent or an inert liquid may be filled between the light-emitting structure and the sealing parts. Though not restrictive, the water-absorbing agents may be barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, a zeolite, magnesium oxide, etc. Though not restrictive, the inert liquids may be paraffin, liquid paraffin, fluorine-containing solvents such as perfluoroalkanes, perfluoroamines and perfluoroethers; chlorine-containing solvents; a silicone oil, etc.

The present invention will be explained in further detail by Examples below without intention of restricting the scope of the present invention defined by the claims attached hereto.

EXAMPLES 1 TO 6, COMPARATIVE EXAMPLES 1 AND 2

(A) Production of Transfer Material A

A temporary support having a thickness of 188 μm made of polyether sulfone available from Sumitomo Bakelite Co., Ltd. was coated on one surface with a liquid for forming an organic, thin-film layer containing 40 parts by mass of a polymer (PTPDES) having a temperature of 186° C., at which its viscosity became $1 \times 10^4$ Pa·s, and Mw of 22,000, which was represented by the following structural formula (I):

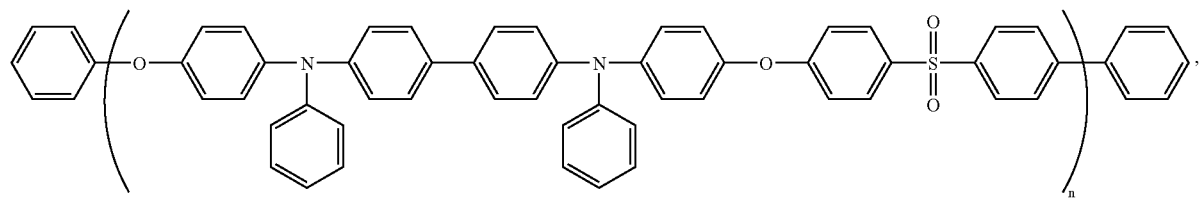

and 3,500 parts by mass of dichloroethane, by an extrusion coater, and dried at room temperature, to produce a transfer material A having a hole-transporting, organic, thin-film layer of 30 nm in thickness formed on the temporary substrate support.

(B) Production of Transfer Materials B-1 to B-6

The same temporary support as in the transfer material A was coated on one surface with a liquid for forming a light-emitting, organic, thin-film layer containing 40 parts by mass of polyvinyl carbazole having Mw of 63,000 available from Aldrich Chemical Co., 15 parts by mass of each additive component shown in Table 1 below, 1 part by mass of tris(2-phenylpyridine) iridium complex (ortho-metallation complex), and 3,500 parts by mass of dichloroethane by a bar coater, and dried at room temperature, to produce the transfer materials B-1 to B-6 each having a light-emitting, organic, thin-film layer of 40 nm in thickness on the temporary substrate support.

Each transfer material B-1 to B-6 was cut to 5 cm each, and the resultant test pieces were laminated with their coated surfaces upward. In a state where these coated surfaces were in contact with the rear surfaces of the adjacent transfer materials, the resultant stack of the test pieces was left to stand in an Ar atmosphere at 30° C. for 3 days with a load of 20 grams placed on the stack. The surface quality of each test piece was evaluated. The evaluation standards of the surface quality were x when there were defects in the coated surface of each transfer material B-1 to B-6, and ○ when there were no defects therein. The evaluation results of the surface quality were shown in Table 1 together with the additive components and their flow-starting temperatures.

TABLE 1

| Transfer Material | Additive Components | Flow-Starting Temperature Tfb | Surface Quality |
|---|---|---|---|
| B-1 | KEMIT R-99[1] | 61° C. | ○ |
| B-2 | TUFTONE U-5[2] | 98° C. | ○ |
| B-3 | KEMIT K-1089[3] | 119° C. | ○ |
| B-4 | S-LEC BM-S[4] | 132° C. | ○ |
| B-5 | Diapet ABS SE-7[5] | 144° C. | ○ |
| B-6* | $C_{12}H_{25}OCO—COO—C_{12}H_{25}$ | 36° C. | X |

Note:
*Comparative Example.
[1]Polyester available from Toray Industries, Inc.
[2]Polyester available from Kao Corporation.
[3]Polyester available from Toray Industries, Inc.
[4]Polyvinyl butyral available from Sekisui Chemical Co., Ltd.
[5]ABS resin available from Mitsubishi Rayon Co., Ltd.

(C) Production of Transfer Material C

The same temporary support as in the transfer material A was coated on one surface with a liquid for forming an electron-transporting, organic, thin-film layer containing 10 parts by mass of polyvinylbutylal (trade name: 2000L) having Mw of 2,000 and a flow-starting temperature Tfb of 128° C. available from Denki Kagaku Kogyo Kabushiki Kaisha, 20 parts by mass of an electron-transporting compound represented by the following structural formula (II):

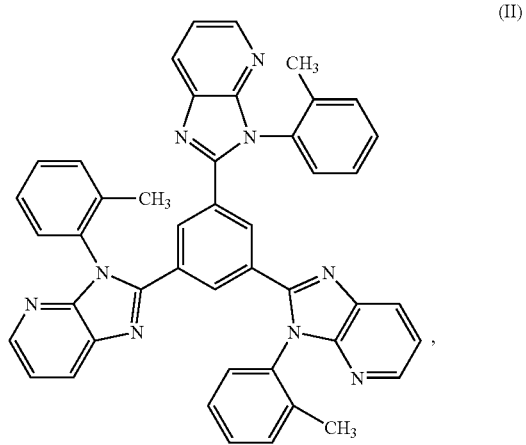

(II)

and 3,500 parts by mass of 1-butanol by an extrusion coater, and dried at 80° C. in vacuum for 2 hours, to produce a transfer material C having an electron-transporting, organic, thin-film layer of 60 nm in thickness on the temporary substrate support.

(D) Production of Organic EL Device (1) Production of Substrate Having Surface to be Coated A glass substrate support of 0.5 mm×2.5 cm×2.5 cm was placed in a vacuum chamber, to form a transparent ITO electrode thereon by DC magnetron sputtering using an ITO target under the conditions that the substrate support was at a temperature of 250° C. and an oxygen pressure was $1\times10^{-3}$ Pa. The ITO target contained 10% by weight of $SnO_2$ with an indium/tin molar ratio of 95/5. The transparent ITO electrode had a thickness of 0.2 μm and a surface resistance of 10 Ω/square. The substrate support with the transparent ITO electrode was washed with isopropyl alcohol (IPA) and then subjected to an oxygen plasma treatment.

(2) Formation of Organic, Thin-film Layer on Surface to be Coated

The oxygen-plasma-treated, transparent ITO electrode was spin-coated with an aqueous dispersion of polyethylenedioxythiophene and polystyrenesulfonate ("Baytron P" available from BAYER AG.) having a solid content of 1.3% and vacuum-dried at 150° C. for 2 hours to form a hole-transporting, organic, thin-film layer D having a thickness of 100 nm.

Another oxygen-plasma-treated, transparent electrode was overlapped with the transfer material A on the side of the hole-transporting, organic, thin-film layer, and caused to pass through a pair of rollers at pressure of 0.3 MPa, one of which was a heating roller at 160° C., at a speed of 0.05 m/minute, to press them while heating from the side of the temporary support of the transfer material A. The temporary support was then peeled from the transfer material A to transfer a hole-transporting, organic, thin-film layer A onto a surface of the transparent electrode.

Overlapped onto a surface of the substrate having the resultant hole-transporting, organic, thin-film layer D or A was each transfer material B-1 to B-6 on the side of the light-emitting, organic, thin-film layer, and the resultant laminate was caused to pass through a pair of rollers heated at a temperature shown in Table 2 at pressure of 0.3 MPa, at a speed of 0.05 m/minute, to press them while heating from the side of the temporary support of each transfer material B-1 to B-6. The temporary support was peeled from each transfer material B-1 to B-6 to transfer each light-emitting, organic, thin-film layer B-1 to B-6 onto a surface of the hole-transporting, organic, thin-film layer (Examples 1 to 6, Comparative Examples 1 and 2).

Similarly, the transfer material C on the side of the electron-transporting, organic, thin-film layer was laminated onto the substrate having each light-emitting, organic, thin-film layer B-1 to B-6, and caused to pass through a pair of rollers at pressure of 0.3 MPa, one of which was a heating roller at 160° C., at a speed of 0.05 m/minute, to press them while heating from the side of the temporary support of the transfer material C. The temporary support was then peeled from the transfer material C, to transfer the electron-transporting, organic, thin-film layer C onto a surface of the light-emitting, organic, thin-film layer (Examples 3, 6, Comparative Example 1).

(3) Production of Rear-surface Electrode

A patterned mask for providing a light-emitting area of 5 mm×5 mm was placed on each light-emitting, organic, thin-film layer (Examples 1, 2, 4 and 5, and Comparative Example 2) or each electron-transporting, organic, thin-film layer (Examples 3 and 6, and Comparative Example 1). Each masked sample was vapor-deposited with magnesium and silver (mole ratio of 10/1) at a thickness of 0.25 μm and silver at a thickness of 0.3 μm to form a rear-surface electrode. Aluminum lead wires were connected to the transparent electrode functioning as an anode and the rear-surface electrode to provide a laminate structure.

(4) Sealing

The laminate structure was put into a glove box filled with a nitrogen gas, and sealed in a sealing glass container by an ultraviolet-curing adhesive "XNR5493" available from Nagase-Chiba Co. to produce an organic EL device.

(E) Evaluation

The organic EL devices were evaluated by the following method. DC voltage was first applied to each organic EL device by Source-Measure Unit 2400 available from Toyo Corporation to cause light emission. Each device emitting light at 200 cd/m$^2$ was observed by a 50-times microscope with respect to the ununiformity of light emission. The evaluation standards of the ununiformity of light emission were as follows. The results are shown in Table 2.
⊚: 90% or more uniformly emitted light,
○: 70% or more uniformly emitted light, though there was unevenness in the intensity of light emission, and
X: There was unevenness in the intensity of light emission, and only less than 70% uniformly emitted light.

TABLE 2

| | Organic, thin-film layer | | | | |
|---|---|---|---|---|---|
| No. | Hole-Transporting Layer | Light-Emitting Layer | Electron-Transporting Layer | Transfer Temperature | Ununiformity of Light Emission |
| Example 1 | D | B-1 | — | 160° C. | ○ |
| Example 2 | A | B-2 | — | 160° C. | ○ |
| Example 3 | D | B-3 | C | 160° C. | ○ |
| Example 4 | D | B-3 | — | 120° C. | ○ |
| Example 5 | A | B-4 | — | 160° C. | ○ |
| Example 6 | A | B-5 | C | 160° C. | ○ |
| Com. Ex. 1 | A | B-6 | C | 160° C. | X* |
| Com. Ex. 2 | A | B-5 | — | 120° C. | X |

Note:
*Soon short-circuited.

EXAMPLES 7 TO 14, COMPARATIVE EXAMPLES 3 AND 4

Materials and production conditions in each Example and Comparative Example were the same as in Example 1 unless otherwise described.

(A) Production of Transfer Material A

The transfer material A was produced in the same manner as in Example 1.

(B) Production of Transfer Materials B-7 to B-16

Using the same coating liquid as in Example 1 except for containing each additive component shown in Table 3, a 40-nm-thick, light-emitting, organic, thin-film layer was formed on a temporary support in the same manner as in Example 1, to produce each transfer material B-7 to B-16. Each of the resultant transfer materials B-7 to B-16 was evaluated with respect to surface quality in the same manner as in Example 1. The evaluation results of the surface quality are shown in Table 3 together with the additive components and their glass transition temperatures Tg.

TABLE 3

| Transfer Material | Additive Components | Glass Transition Temp. Tg | Surface Quality |
|---|---|---|---|
| B-7 | KEMIT K-1089[1] | 43° C. | ○ |
| B-8 | TUFTONE U-2[2] | 56° C. | ○ |
| B-9 | Vylon 200[3] | 67° C. | ○ |
| B-10 | Elitel XA-7539[4] | 90° C. | ○ |
| B-11 | S-LEC KS-10[5] | 106° C. | ○ |
| B-12 | Polycarbonate[6] | 145° C. | ○ |
| B-13 | Polyarylate[7] | 193° C. | ○ |
| B-14 | Polyvinyl Carbazole[8] | 220° C. | ○ |
| B-15* | KEMIT R-283[9] | 15° C. | X |
| B-16* | 100 parts by weight of Vylon 200, and 10 parts by weight of Takenate TKP-90[10] | 300° C. or higher[11] | ○ |

Note:
*Comparative Example.
[1]Polyester available from Toray Industries, Inc.
[2]Polyester available from Kao Corporation.
[3]Polyester available from TOYOBO CO., LTD.
[4]Polyester available from UNITIKA LTD.
[5]Polyvinyl butyral available from Sekisui Chemical Co., Ltd.
[6]Available from TEIJIN CHEMICALS LTD.
[7]Available from KANEGAFUCHI CHEMICAL INDUSTRY CO., LTD.

TABLE 3-continued

| Transfer Material | Additive Components | Glass Transition Temp. Tg | Surface Quality |
|---|---|---|---|

[8]# Rubikam available from Aldrich.
[9]Polyester available from Toray Industries, Inc.
[10]Polyisocyanate available from Takeda Chemical Industries, Ltd.
[11]Could not be measured because of decomposition.

(C) Production of Transfer Material C

The same electron-transporting, organic, thin-film layer as in Example 1 was formed on one surface of the same temporary support as the transfer material A to produce a transfer material C. Incidentally, polyvinyl butyral (trade name: 2000L) used had a glass transition temperature Tg of 63° C.

(D) Production of Organic EL Device

The same hole-transporting, organic, thin-film layer D as in Example 1 was formed on a surface of an oxygen-plasma-treated transparent electrode on a glass plate. Also, the same hole-transporting, organic, thin-film layer A as in Example 1 was transferred onto a surface of another oxygen-plasma-treated transparent electrode.

Each light-emitting, organic, thin-film layer B-7 to B-16 was transferred onto a surface of the resultant hole-transporting, organic, thin-film layer D or A in the same manner as in Example 1 (Examples 7 to 14, Comparative Examples 3 and 4). Similarly, each electron-transporting, organic, thin-film layer C was transferred onto a surface of the substrate having each light-emitting, organic, thin-film layer B-7 to B-16 in the same manner as in Example 1 (Examples 9, 10, 13, 14, Comparative Example 4).

A rear-surface electrode was formed on each light-emitting, organic, thin-film layer (Examples 7, 8, 11, 12, Comparative Example 3) and each electron-transporting, organic, thin-film layer (Examples 9, 10, 13, 14, Comparative Example 4) in the same manner as in Example 1. Aluminum lead wires were connected to the transparent electrode functioning as an anode and the rear-surface electrode to form a laminate structure. Each of the resultant laminate structures was sealed in the same manner as in Example 1 to produce an organic EL device. Each of the resultant organic EL devices was evaluated with respect to the ununiformity of light emission in the same manner as in Example 1. The results are shown in Table 4.

TABLE 4

| | Organic, thin-film layer | | | |
|---|---|---|---|---|
| No. | Hole-Transporting Layer | Light-Emitting Layer | Electron-Transporting Layer | Ununiformity of Light Emission |
| Example 7 | A | B-7 | — | ◯ |
| Example 8 | D | B-8 | — | ◯ |
| Example 9 | D | B-9 | C | ◯ |
| Example 10 | A | B-10 | C | ◯ |
| Example 11 | A | B-11 | — | ◯ |
| Example 12 | D | B-12 | — | ◯ |
| Example 13 | A | B-13 | C | ◯ |
| Example 14 | D | B-14 | C | ◯ |
| Com. Ex. 3 | D | B-15 | — | X* |
| Com. Ex. 4 | D | B-16 | C | X* |

Note:
*Soon short-circuited.

EXAMPLES 15 TO 23, COMPARATIVE EXAMPLES 5 AND 6

Materials and production conditions in each Example and Comparative Example were the same as in Example 1 unless otherwise described.

(A) Production of Transfer Material A

The transfer material A was produced in the same manner as in Example 1.

(B) Production of Transfer Materials B-17 to B-27

Transfer materials B-17 to B-27 each having a 40-nm-thick, light-emitting, organic, thin-film layer formed on a temporary support were produced, in the same manner as in Example 1 except for using a coating liquid for a light-emitting, organic, thin-film layer containing each additive component shown in Table 5. Each of the resultant transfer materials B-17 to B-27 was evaluated with respect to surface quality in the same manner as in Example 1. The evaluation results of the surface quality are shown in Table 5 together with the additive components used and the temperature at which their viscosity became $1 \times 10^4$ Pa·s.

TABLE 5

| Transfer Material | Additive Components | Temperature at Which Viscosity Became $1 \times 10^4$ Pa·s | Surface Quality |
|---|---|---|---|
| B-17 | $C_{17}H_{35}CON(CH_3)_2$ | 40° C. | ◯ |
| B-18 | 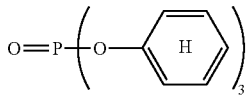 | 60° C. | ◯ |
| B-19 | $\begin{array}{c}CH_2COOCH_3\\|\\HO—C—COOCH_3\\|\\CH_2COOCH_3\end{array}$ | 79° C. | ◯ |
| B-20 | TUFTONE U-5[1] | 101° C. | ◯ |
| B-21 | KEMIT K-1089[2] | 106° C. | ◯ |
| B-22 | Vylon 200[3] | 128° C. | ◯ |
| B-23 | Vylon 280[4] | 148° C. | ◯ |
| B-24 | polyvinyl carbazole[5] | 202° C. | ◯ |
| B-25 | S-LEC BX-5[6] | 236° C. | ◯ |
| B-26* | $C_{12}H_{25}OCO—COO—C_{12}H_{25}$ | 36° C. | X |
| B-27* | S-LEC BX-1[7] | 249° C. | ◯ |

Note:
*Comparative Example.
[1]Polyester available from Kao Corporation.
[2]Polyester available from Toray Industries, Inc.
[3]Polyester available from TOYOBO CO., LTD.
[4]Polyester available from TOYOBO CO., LTD.
[5]Available from Aldrich.
[6]Polyvinyl butyral available from Sekisui Chemical Co., Ltd.
[7]Polyvinyl butyral available from Sekisui Chemical Co., Ltd.

(C) Production of Transfer Material C

The same electron-transporting, organic, thin-film layer as in Example 1 was formed on one surface of the same temporary support as in the transfer material A to produce a transfer material C. Incidentally, polyvinyl butyral (trade name: 2000L) used had a temperature of 135° C., at which its viscosity became $1 \times 10^4$ Pa·s.

(D) Production of Organic EL Device

A hole-transporting, organic, thin-film layer D having a thickness of 100 nm was formed in the same manner as in Example 1. Also, a hole-transporting, organic, thin-film layer A was transferred onto a surface of another oxygen-plasma-treated transparent electrode in the same manner as in Example 1.

Each light-emitting, organic, thin-film layer B-17 to B-27 was transferred onto a surface of the resultant hole-transporting, organic, thin-film layer D or A in the same manner as in Example 1. Similarly, an electron-transporting, organic, thin-film layer C was transferred onto a surface of a substrate having each light-emitting, organic, thin-film layer B-17 to B-27 in the same manner as in Example 1. A rear-surface electrode was formed on each light-emitting, organic, thin-film layer (Examples 15, 16, 19, 20, 23) or each electron-transporting, organic, thin-film layer (Examples 17, 18, 21, 22, Comparative Examples 5, 6) in the same manner as in Example 1. Aluminum lead wires were connected to the transparent electrode functioning as an anode and the rear-surface electrode to form a laminate structure. Each of the resultant laminate structures was sealed in the same manner as in Example 1 to produce an organic EL device. The resultant organic EL devices were evaluated in the same manner as in Example 1. The results are shown in Table 6.

TABLE 6

| | Organic, thin-film layer | | | |
|---|---|---|---|---|
| No. | Hole-Transporting Layer | Light-Emitting Layer | Electron-Transporting Layer | Ununiformity of Light Emission |
| Example 15 | D | B-17 | — | ○ |
| Example 16 | A | B-18 | — | ○ |
| Example 17 | D | B-19 | C | ○ |
| Example 18 | D | B-20 | C | ○ |
| Example 19 | A | B-21 | — | ○ |
| Example 20 | A | B-22 | — | ○ |
| Example 21 | D | B-23 | C | ○ |
| Example 22 | D | B-24 | C | ○ |
| Example 23 | D | B-25 | — | ○ |
| Com. Ex. 5 | D | B-26 | C | X* |
| Com. Ex. 6 | D | B-27 | C | X* |

Note:
*Soon short-circuited.

When organic, thin-film layers were transferred in the same manner as in the above Examples except for changing the substrate support from a square glass plate to a continuous web of polyethylene terephthalate having a thickness of 75 μm, the same results were obtained with high productivity.

As described above in detail, by carrying out a peeling transfer method using a transfer material meeting any one of the conditions that at least one component constituting the organic, thin-film layer has (a) a flow-starting temperature of 40° C. or higher and a transfer temperature or lower, or (b) a glass transition temperature Tg of 40° C. to 250° C., and that (c) a temperature at which its viscosity becomes $1 \times 10^4$ Pa·s is 40° C. to 240° C., it is possible to produce an organic, thin-film device such as an organic EL device, etc. having excellent uniformity of light emitted at a low cost.

What is claimed is:

1. A transfer material having at least one organic thin-film layer on a temporary substrate support, comprising a light-emitting organic thin-film layer, an electron-transporting organic thin-film layer and a hole-transporting organic thin-film layer on a temporary substrate support, wherein at least one component constituting each of said light-emitting organic thin-film layer, said electron-transporting organic thin-film layer and said hole-transporting organic thin-film layer has a flow-starting temperature in the range of 40° C. to a transfer temperature.

2. A transfer material having at least one organic, thin-film layer on a temporary substrate support, comprising a light-emitting organic thin-film layer, an electron-transporting organic thin-film layer and a hole-transporting organic thin-film layer on a temporary substrate support, wherein at least one component constituting each of said light-emitting organic thin-film layer, said electron-transporting organic thin-film layer and said hole-transporting organic thin-film layer has a glass transition temperature Tg of 40° C. to 250° C.

3. A transfer material having at least one organic, thin-film layer on a temporary substrate support, comprising a light-emitting organic thin-film layer, an electron-transporting organic thin-film layer and a hole-transporting organic thin-film layer on a temporary substrate support, wherein at least one component constituting each of said light-emitting organic thin-film layer, said electron-transporting organic thin-film layer and said hole-transporting organic thin-film layer has a predetermined viscosity reaching temperature in the range of 40° C. to 240° C., at which its viscosity becomes $1 \times 10^4$ Pa·s.

4. A method for producing an organic, thin-film device comprising the steps of:
   (a) overlapping a transfer material comprising at least one organic, thin-film layer on a temporary support and a substrate, said organic, thin-film layer comprising a light-emitting organic thin-film layer, an electron-transporting organic thin-film layer and a hole-transporting organic thin-film layer, such that said organic, thin-film layer faces a surface to be coated of said substrate, and heating or pressing or both heating and pressing said transfer material and said substrate, and
   (b) peeling said temporary support from said transfer material to transfer said organic, thin-film layer onto said surface of said substrate, wherein at least one component constituting each of said light-emitting organic thin-film layer, said electron-transporting organic thin-film layer and said hole-transporting organic thin-film layer has a flow-starting temperature in the range of 40° C. to a transfer temperature.

5. A method f or producing an organic, thin-film device comprising the steps of:
   (a) overlapping a transfer material comprising at least one organic, thin-film layer on a temporary support and a substrate, said organic, thin-film layer comprising a light-emitting organic thin-film layer, an electron-transporting organic thin-film layer and a hole-transporting organic thin-film layer, such that said organic, thin-film layer faces a surface to be coated of said substrate, and heating or pressing or both heating and pressing said transfer material and said substrate, and
   (b) peeling said temporary support from said transfer material to transfer said organic, thin-film layer onto said surface of said substrate, wherein at least one component constituting each of said light-emitting organic thin-film layer, said electron-transporting organic thin-film layer and said hole-transporting organic thin-film layer has a glass transition temperature Tg of 40° C. to 250° C.

6. A method for producing an organic, thin-film device comprising the steps of:
   (a) overlapping a transfer material comprising at least one organic, thin-film layer on a temporary support and a substrate, said organic, thin-film layer comprising a light-emitting organic thin-film layer, an electron-transporting organic thin-film layer and a hole-transporting organic thin-film layer such that said organic, thin-film layer faces a surface to be coated of said substrate, and heating or pressing or both heating and pressing said transfer material and said substrate, and
   (b) peeling said temporary support from said transfer material to transfer said organic, thin-film layer onto said surface of said substrate, wherein at least one component constituting each of said light-emitting organic thin-film layer, said electron-transporting organic thin-film layer and said hole-transporting organic thin-film layer has a predetermined viscosity-reaching temperature in the range of 40° C. to 240° C., at which its viscosity becomes $1 \times 10^4$ Pa·s.

7. The transfer material of claim 1, wherein said flow-starting temperature is in the range of from 40° C. to 250° C.

8. The method of claim 4, wherein said flow-starting temperature is in the range of from 40° C. to 250° C.

* * * * *